United States Patent [19]
Avanzino et al.

[11] Patent Number: 6,137,126
[45] Date of Patent: Oct. 24, 2000

[54] METHOD TO REDUCE GATE-TO-LOCAL INTERCONNECT CAPACITANCE USING A LOW DIELECTRIC CONSTANT MATERIAL FOR LDD SPACER

[75] Inventors: Steven C. Avanzino, Cupertino; Minh Van Ngo; Angela T. Hui, both of Fremont; Chun Jiang, San Jose; Hamid Partovi, Sunnyvale, all of Calif.

[73] Assignee: Advanced Micro Devices, Inc., Sunnyvale, Calif.

[21] Appl. No.: 09/375,499

[22] Filed: Aug. 17, 1999

[51] Int. Cl.$^7$ .............. H01L 29/72; H01L 27/10; H01L 21/336
[52] U.S. Cl. ............... 257/288; 257/340; 257/386; 257/900; 438/303
[58] Field of Search ................... 257/335, 336, 257/340, 344, 346, 386, 387, 900, 288, 324, 632; 438/303

[56] References Cited

U.S. PATENT DOCUMENTS

| | | | |
|---|---|---|---|
| 4,769,686 | 9/1988 | Horiuchi et al. | 357/23.8 |
| 5,162,882 | 11/1992 | Pollack | 257/349 |
| 5,608,247 | 3/1997 | Brown | 257/306 |
| 5,744,387 | 4/1998 | Tseng | 438/253 |
| 5,965,934 | 10/1999 | Cheung et al. | 257/642 |

*Primary Examiner*—Matthew Smith
*Assistant Examiner*—Lex H. Malsawma

[57] ABSTRACT

The capacitance between a gate electrode of a transistor and local interconnect is reduced by employing SiC sidewall spacers on the side surfaces of the gate electrode when forming the source/drain regions with shallow extensions. Embodiments include forming SiC sidewall spacers at a width of about 500 Å to about 800 Å having a dielectric constant of less than about 3.2, depositing a silicon oxide inter-dielectric layer, and forming the local interconnect through the inter-dielectric layer. The resulting composite dielectric constant between the gate electrode and local interconnect is about 4.2 to about 4.7.

10 Claims, 1 Drawing Sheet

METHOD TO REDUCE GATE-TO-LOCAL INTERCONNECT CAPACITANCE USING A LOW DIELECTRIC CONSTANT MATERIAL FOR LDD SPACER

RELATED PATENT APPLICATION

This patent application contains subject matter related to subject matter disclosed in co-pending U.S. patent application Ser. No. 09/375,500, filed on Aug. 17, 1999, entitled "INTERCONNECT METHOD EMPLOYING A LOW DIELECTRIC CONSTANT ETCH STOP LAYER" the entire disclosure of which is incorporated herein by reference.

TECHNICAL FIELD

The present invention relates to high density semiconductor devices with increased circuit speed and to a method of manufacturing such devices.

BACKGROUND

Integrated circuit designs have numerous active devices such as transistors laid out on a common substrate, typically silicon. A continuing trend in semiconductor technology is to build integrated circuits with more and/or faster semiconductor devices. The drive toward this ultra large-scale integration (ULSI) has resulted in continued shrinking of active devices and circuit features.

In order to achieve higher device density, smaller geometry devices have been developed. Isolation regions separate the active devices to prevent electrical interference between them. Such isolation regions may be formed early in the fabrication process by masking the active regions and growing an insulator, such as an oxide, in the non-masked isolation regions. The grown oxide, referred to as a field oxide, serves to isolate and define the active regions. The active devices are formed by various processing steps and then covered with an insulator.

In order to interconnect the various active devices, one or more overlying metalization layers are formed on top of the insulator with connections to the devices provided by conductively filled openings in the insulator. The various devices are thereby interconnected between adjacent active devices that may be disposed underneath the insulating layer. The initial interconnection, known as local interconnects ("LI"), is formed between transistors on the main surface of the semiconductor substrate.

A local interconnect is typically formed between two active devices, e.g., the source/drain region of the transistor and gate electrode of a neighboring transistor. However, local interconnects may also be formed between polysilicon gate regions. In general, local interconnects are used to electrically connect electrodes of active devices within an integrated circuit to provide an electrical connection between two or more conducting or semi-conducting regions (e.g., active regions of one or more devices). For example, a plurality of transistors can be connected to form an inverting logic circuit using a local interconnect.

Local interconnects typically comprise a relatively low-resistance material, such as a conductor or doped semiconductor, that is formed to electrically couple the selected regions. For example, in certain arrangements, damascene techniques are used to provide local interconnects made of tungsten (W), titanium/titanium nitride or a like conductor metal, which is deposited within an etched opening.

Sidewall spacers, also known as lightly-doped drain (LDD) spacers are typically formed on the side surfaces of gate electrodes to electrically isolate the gate electrode from source and drain contacts or interconnects. Sidewall spacers generally prevent heavy-dose source/drain implants from completely overlapping LDD regions next to the gate. In addition, sidewall spacers may be formed to allow the removal of subsequently formed dielectric layers without the possibility of removing a portion of a conductive device around which the sidewall spacer is formed, i.e., they may be used as a mask. Sidewall spacers are typically formed by depositing a conformal layer of dielectric material followed by anisotropic etch back techniques. Conventional dielectric materials employed to form sidewall spacers include $SiO_2$, $SiO_2$, or SiN, which have a dielectric constant K of about 4 to about 7.

As circuit density increases, demands for more efficient, effective and precise processes for forming smaller local interconnects increase. However, as devices are scaled into the deep sub-micron range, as with a design rule of about 0.18 microns and under, e.g., about 0.15 micron and under, the increased capacitance between a gate electrode, e.g., doped polysilicon, and a tungsten or copper local interconnect, becomes significant. These narrow spaces are frequently filled with a high dielectric constant material, such as SiN or SiON. As such, it has been found difficult to provide low RC (resistance capacitance) interconnection patterns, particularly where sub-micron via contacts and trenches have high aspect ratios imposed by miniaturization. Accordingly, there is need to reduce the composite dielectric constant of the materials between a gate electrode and local interconnection ("poly-LI"). It would be advantageous if the composite K between gate-LI is lowered to a range of about 3 to about 5.5, preferably 4.2 to about 4.7. Lower-K materials provide less capacitance, increasing the propagation speed of electrical signals. Thus, the use of lower K materials in the formation of sidewall spacers would provide a semiconductor chip with an overall lower RC delay and an improved operating speed relative to prior designs.

SUMMARY OF THE INVENTION

The above and other needs are met by the present invention, which provides a method for substantially reducing the composite dielectric constant of the materials between poly-LI. In a preferred embodiment, the present invention is a method for manufacturing a semiconductor device, the method comprising:

forming a field dielectric region on a main surface of a semiconductor substrate isolating an active region;

forming a transistor in the active region, the transistor comprising:
  a first gate electrode having side surfaces on the main surface with a gate dielectric layer therebetween;
  silicon carbide sidewall spacers on the side surfaces of the gate electrode; and
  source/drain regions having shallow extensions in the substrate with a channel region therebetween and underlying the gate electrode;

forming a second gate electrode extending on the field dielectric region;

depositing an inter-dielectric layer (a.k.a. inter-layer dielectric);

etching to form an opening in the inter-dielectric layer exposing a portion of a source/drain region, field dielectric region and second gate electrode; and filling the opening with a conductive material to form a local interconnect between the source/drain region and second gate electrode.

Another aspect of the present invention is a semiconductor device comprising:

a semiconductor substrate having a main surface;

a field dielectric region on the main surface isolating an active region;

a transistor formed in the active region, the transistor comprising:

a first gate electrode having side surfaces on the main surface with a gate dielectric layer therebetween;

silicon carbide (SiC) sidewall spacers on the side surfaces of the first gate electrode; and source/drain regions in the substrate with a channel region therebetween and underlying the first gate electrode;

a second gate electrode extending on the field dielectric region;

an inter-dielectric layer over the transistor, field dielectric region and second gate electrode;

an opening in the inter-dielectric layer exposing a portion of a source/drain region, field dielectric layer and second gate electrode; and conductive material filling the opening forming a local interconnect between the source/drain region and second gate electrode.

The semiconductor device may be made according to the above method.

The foregoing and other features, aspects and advantages of the present invention will become more apparent to the skilled artisan from the following detailed description of the present invention when taken in conjunction with the accompanying drawing.

BRIEF DESCRIPTION OF THE DRAWINGS

The present invention is illustrated by way of example, and not by way of limitation, in the figures of the accompanying drawing and in which like reference numerals refer to similar elements in which.

Figure 1:
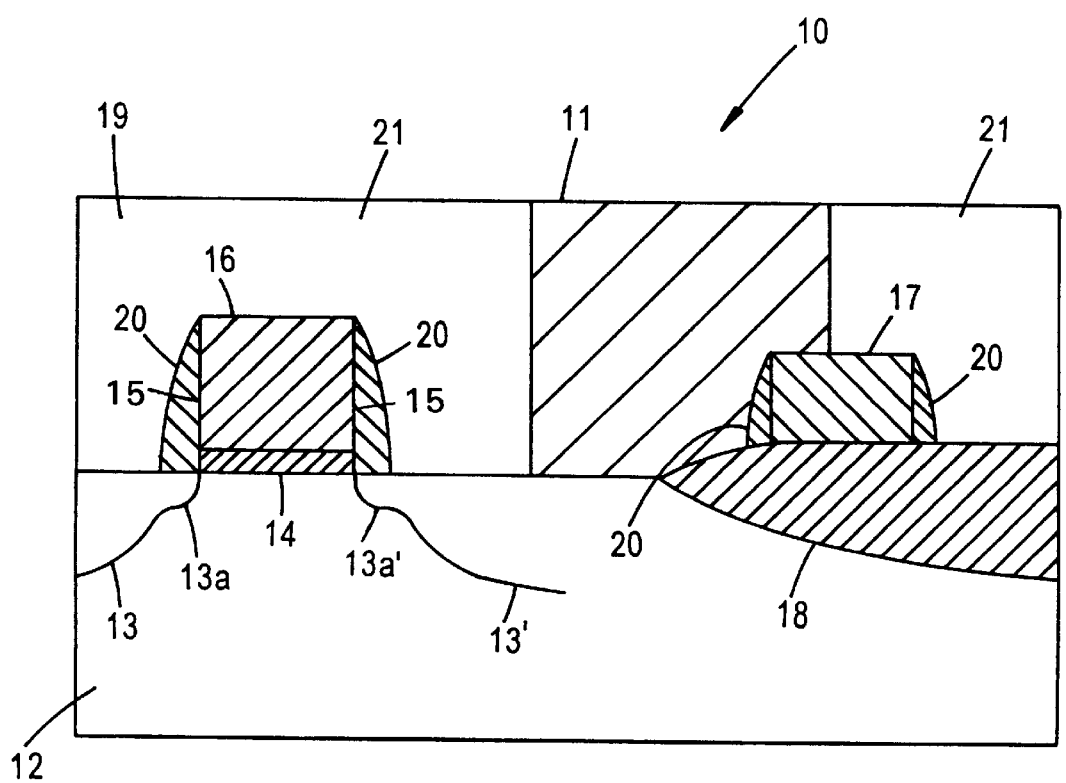
FIG. 1 schematically depicts a cross-sectional view of an embodiment of the present invention comprising SiC sidewall spacers and a local interconnect located nearby.

The FIGURE representing a cross-section of a portion of an integrated circuit device during fabrication is not drawn to scale, but instead is drawn to illustrate the features of the present invention.

DESCRIPTION OF THE INVENTION

It will be appreciated that the process steps and structures described below do not form a complete process flow for manufacturing integrated circuits. Conventional semiconductor manufacturing techniques are not elaborated upon to avoid obfuscating the inventive contributions. The present invention can be practiced utilizing conventional integrated circuit fabrication techniques, and so much of the commonly practiced process steps are included as are necessary for an understanding of the present invention.

FIG. 1 depicts a cross-section of a portion 10 of a semiconductor wafer in accordance with an embodiment of the present invention. Portion 10 includes a substrate 12, typically doped single crystal silicon, in which transistor 19 is formed and contains gate electrode 16, gate dielectric layer 14, source/drain regions 13, 13' and shallow source/drain extensions 13a, 13a'. SiC sidewall spacers 20 are formed on side surfaces 15 of gate electrode 16 overlying shallow source/drain extensions 13a, 13a'. Gate electrode 17 of a neighboring transistor (not shown) extends on field dielectric region 18 and is connected to source/drain region 13 by local interconnect 11 formed through inter-dielectric layer 21.

SiC sidewall spacers 20 can be formed by depositing a conformal layer of SiC and anisotropically etching, as by employing oxygen-based etchant chemistry in the presence of a fluorine species ($CF_4$, $SF_6$, $CHF_3$, $CH_3F$). SiC has a dielectric constant (K) of less than about 3.2, which is considerably less than that of silicon nitride (e.g., $Si_3N_4$) (K of about 7), silicon oxide (K of about 4) and silicon oxynitride (SiON) (K of about 5.5), conventional sidewall spacer materials.

As in conventional LDD methodology, using gate electrode 16 as a mask, ion implantation is conducted to form lightly or moderately doped source/drain extension implants. SiC sidewall spacers 20 are then formed on side surfaces 15 of gate 16. Ion implantation is then conducted to form moderately or heavily doped source/drain implants. Thermal annealing is then conducted for diffusion and activiation to form source/drain regions 13, 13' and shallow extensions 13a, 13a'.

As mentioned above, prior to the present invention, sidewall spacers 20 comprised a high dielectric constant material, such as silicon oxide, silicon nitride or silicon oxynitride. According to the present invention, SiC is utilized in place of such high dielectric constant materials to form sidewall spacers 20. The SiC sidewall spacers 20 of the present invention have a low dielectric constant of less than about 3.2.

The present invention enables a reduction in the composite dielectric constant between gate electrode 16 and local interconnect 11 to about 3 to about 5, preferably about 4.2 to about 4.7, as in when employing a silicon oxide inter-dielectric layer 21.

The SiC dielectric layer used to form the SiC sidewall spacers can be deposited from SiC source gases such as $SiH_4$ and $CH_4$ using plasma conditions attainable in conventional PECVD or HDP reactors. The dielectric constant of SiC deposited in this manner is less than about 3.2. The thickness of each SiC sidewall spacer may range between about 500 Å to about 800 Å. The deposited SiC film is anisotropically etched back using oxygen-based chemistry, dry etching or like technique, thereby forming a pair of sidewall spacers 20 on the side faces of the gate 16.

The methods and arrangements of the present invention advantageously utilize conventional fabrication processes including, for example, implantation, deposition, etching, and/or CMP processes. The methods and arrangements in accordance with the principles of the present invention are fully adaptable to different semiconductor devices having different materials and/or critical dimensions.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for manufacturing a semiconductor device, the method comprising:

forming a field dielectric region on a main surface of a semiconductor substrate isolating an active region;

forming a transistor in the active region, the transistor comprising:

a first gate electrode, having side surfaces, on the main surface with a gate dielectric layer therebetween;

silicon carbide sidewall spacers on the side surfaces of the gate electrode; and source/drain regions having shallow extensions in the substrate with a channel region therebetween and underlying the gate electrode;

forming a second gate electrode extending on the field dielectric region;

depositing an inter-dielectric layer over the transistor, field dielectric region and second gate electrode;

etching to form an opening in the inter-dielectric layer exposing a portion of a source/drain region, field dielectric region and second gate electrode; and filling the opening with a conductive material to form a local interconnect between the source/drain region and second gate electrode, wherein the composite dielectric constant between the first gate electrode and local interconnect is about 4.2 to about 4.7.

2. The method of claim 1, comprising:

forming the first gate electrode on the main surface with a gate dielectric layer therebetween;

ion implanting dopant impurities to form lightly or moderately doped shallow source/drain extension implants;

depositing a conformal layer of SiC on the first gate electrode;

anisotropically etching to form the SiC sidewall spacers on the side surfaces of the first gate electrodes;

ion implanting dopant impurities to form moderately or heavily doped source/drain implants; and annealing to activate the source/drain regions and shallow source/drain extensions.

3. The method of claim 1, comprising depositing a layer of silicon oxide as the inter-dielectric layer.

4. The method of claim 3, wherein the SiC sidewall spacers have a dielectric constant of less than about 3.2.

5. The method of claim 1, wherein each SiC sidewall spacer has a thickness of about 500 Å to about 800 Å.

6. A semiconductor device comprising:

a semiconductor substrate having a main surface;

a field dielectric region on the main surface isolating an active region;

a transistor formed in the active region, the transistor comprising:

a first gate electrode, having side surfaces, on the main surface with a gate dielectric layer therebetween;

SiC sidewall spacers on the side surfaces of the first gate electrode; and source/drain regions in the substrate with a channel region therebetween and underlying the first gate electrode;

a second gate electrode extending on the field dielectric region;

an inter-dielectric layer over the transistor, field dielectric region and second gate electrode;

an opening in the inter-dielectric layer exposing a portion of a source/drain region, field dielectric layer and second gate electrode; and conductive material filling the opening forming a local interconnect between the source/drain region and second gate electrode, wherein the composite dielectric constant between the first gate electrode and the local interconnect is about 4.2 to about 4.7.

7. The semiconductor device of claim 6, wherein each source/drain region comprises a shallow source/drain extension extending under a SiC sidewall spacer.

8. The semiconductor device of claim 6, wherein each SiC sidewall spacer has a thickness of about 500 Å to about 800 Å.

9. The semiconductor device of claim 6, wherein the inter-dielectric layer comprises silicon oxide.

10. The semiconductor device of claim 9, wherein the SiC sidewall spacers have a dielectric constant of less than about 3.2.

* * * * *